United States Patent [19]

Masuda et al.

[11] 4,376,918
[45] Mar. 15, 1983

[54] OVERTONE CRYSTAL OSCILLATING CIRCUIT

[75] Inventors: Eiji Masuda; Shigemi Sakamoto, both of Kawasaki, Japan

[73] Assignee: Tokyo Shibaura Denki Kabushiki Kaisha, Japan

[21] Appl. No.: 190,951

[22] Filed: Sep. 26, 1980

[30] Foreign Application Priority Data

Oct. 4, 1979 [JP] Japan .................. 54-128393

[51] Int. Cl.³ .............................. H03B 5/36
[52] U.S. Cl. .................. 331/116 FE; 331/158
[58] Field of Search ............. 331/116 R, 116 FE, 158

[56] References Cited

U.S. PATENT DOCUMENTS

| | | | |
|---|---|---|---|
| 3,676,801 | 7/1972 | Musa | 331/116 R |
| 3,803,828 | 4/1974 | Keeler et al. | 331/116 FE X |
| 3,836,873 | 9/1974 | Healey et al. | 331/116 R |
| 4,032,864 | 6/1977 | Yamashiro et al. | 331/116 FE |
| 4,039,972 | 8/1977 | Scholten et al. | 331/158 X |
| 4,101,848 | 7/1978 | Yamashita | 331/116 R |

FOREIGN PATENT DOCUMENTS 54-121645  9/1979  Japan .................. 331/158

OTHER PUBLICATIONS

Bowers et al, "A Precision Oscilloscope Calibrator", Elettronica Oggi, Italy, Jan. 1980, pp. 160, 162.

Primary Examiner—Siegfried H. Grimm
Attorney, Agent, or Firm—Finnegan, Henderson, Farabow, Garrett & Dunner

[57] ABSTRACT

An overtone crystal oscillating circuit is disclosed which includes a complementary MOS inverter formed of P and N channel MOS transistors, a crystal resonator and a feedback resistor which are connected between input and output terminals of the complementary MOS inverter, and first and second capacitors respectively connected to the input and output terminals of the complementary MOS inverter. The crystal oscillating circuit is further provided with a series circuit formed of an inductor and a capacitor and connected in parallel with the first or second capacitor to form a parallel resonant circuit.

16 Claims, 18 Drawing Figures

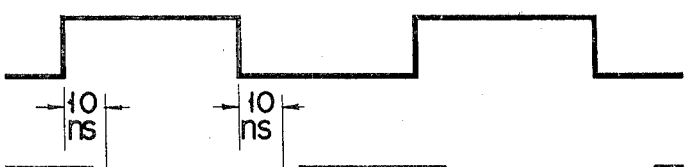
FIG. 5A
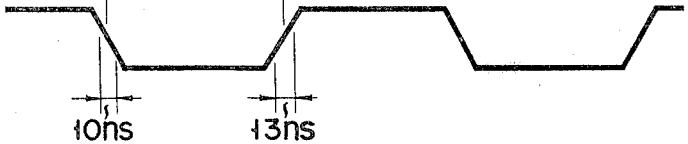
FIG. 5B
FIG. 6
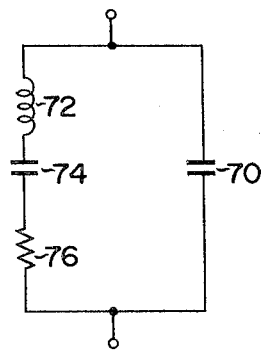
FIG. 7
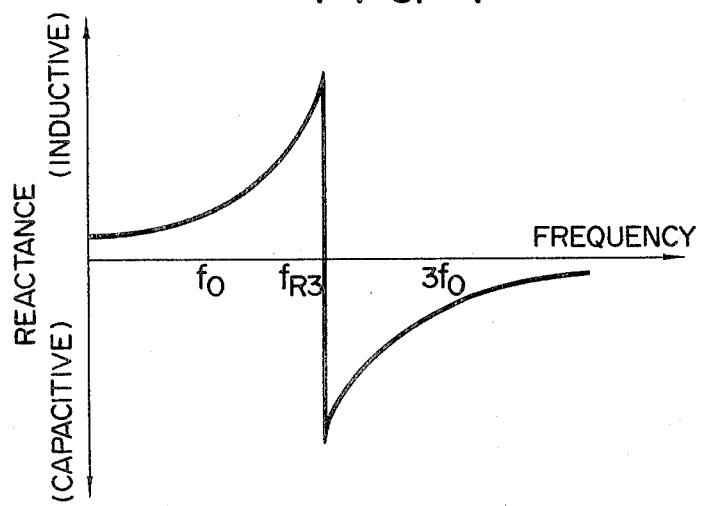

OVERTONE CRYSTAL OSCILLATING CIRCUIT

BACKGROUND OF THE INVENTION

The present invention relates to an overtone crystal oscillating circuit including a complementary MOS inverter and a crystal resonator. FIG. 1 shows a conventional crystal oscillating circuit having a CMOS inverter 2 and a crystal resonator 4 connected between input and output terminals of the CMOS inverter 2. The CMOS inverter 2 is comprised of P and N channel insulated gate type MOS transistors 6 and 8 of which the current paths are connected in series between a positive power source terminal $V_D$ and a reference power source terminal $V_S$ which is grounded, for example. A DC feedback resistor 10 is connected between the input and output terminals of the CMOS inverter 2. A variable capacitor 12 and a capacitor 14 are connected between the input terminal of the CMOS inverter 2 and ground. A capacitor 16 is connected between the output terminal of the CMOS inverter 2 and ground.

In the crystal oscillating circuit of FIG. 1, the crystal oscillating resonator 4 and capacitors 12, 14 and 16 cooperate to constitute a resonance circuit which is driven by a drive circuit including the CMOS inverter 2 and resistor 10 to perform an oscillating operation. It is often required to obtain a high oscillating frequency using the crystal oscillating circuit. However, the maximum value of the oscillating frequency of the crystal oscillating circuit is limited to about 14 MHz due to restrictions such as a restrictive factor in manufacturing of the crystal oscillating resonator 4, delay time of CMOS inverter 2, and a limit of the gain.

For this reason, in order to construct a crystal oscillating circuit for providing a frequency higher than 14 MHz, it has been a common practice to use an overtone crystal oscillating circuit including, as shown in FIG. 2, a bipolar transistor 18, a crystal oscillating resonator 20 and a circuit 22 which, together with the crystal oscillating resonator 20, forms a resonance circuit and includes a number of tuning passive elements to apply a bias voltage to the bipolar transistor. Thus, the crystal oscillating circuit performs the oscillating operation at an odd harmonic of the fundamental frequency of the crystal resonator.

Thus, the conventional overtone oscillating circuit of this kind is disadvantageous in that a number of circuit elements are used, increasing the cost and resulting in susceptibility to variation of the power source voltage and poor reliability of the operation. A MOS process, which has dominantly been used for manufacturing modern semiconductor devices, is not applicable for manufacturing the oscillating circuit shown in FIG. 2. Therefore, it is impossible to form the oscillating circuit shown in FIG. 2 on the same chip of a semiconductor device manufactured by the MOS process.

SUMMARY OF THE INVENTION

Accordingly, an object of the invention is to provide an overtone crystal oscillating circuit which can perform an oscillation at a frequency higher than a fundamental frequency of the crystal resonator.

According to one aspect of the invention, there is provided an overtone crystal oscillating circuit comprising: a complementary MOS inverter circuit having input and output terminals; a crystal resonator and a feedback resistor which are respectively connected to the input and output terminals of the inverter circuit; first and second capacitances which are respectively connected to the input and output terminals of the inverter circuit; and a series circuit including inductances and capacitances which is connected in parallel to at least one of the first and second capacitances.

Other objects and features of the invention will be apparent from the following description in connection with the accompanying drawings, in which:

BRIEF DESCRIPTION OF THE DRAWINGS

FIGS. 5A and 5B respectively show waveforms of input and output signals of the CMOS inverter in FIG. 4;

FIG. 6 is a circuit diagram of an equivalent circuit of the resonator used in the crystal oscillating circuit in FIG. 3;

FIG. 7 is a graph illustrating a reactance-frequency characteristic of a tuning circuit used in the crystal oscillating circuit in FIG. 3;

DETAILED DESCRIPTION OF THE PREFERRED EMBODIMENTS

Figure 1:
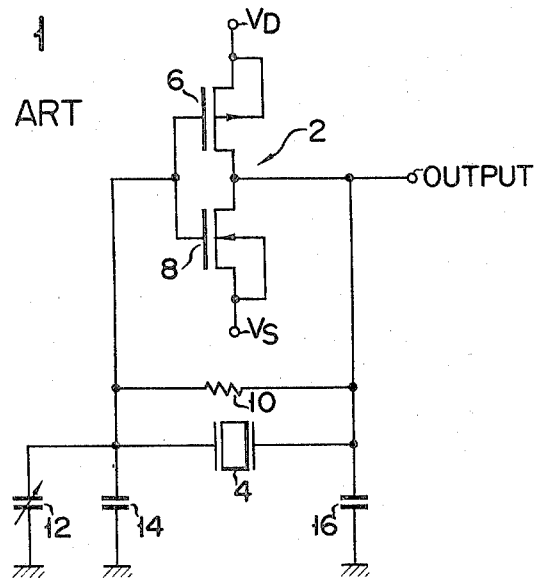
FIG. 1 is a circuit diagram of a conventional crystal oscillating circuit having a CMOS inverter.
Figure 2:
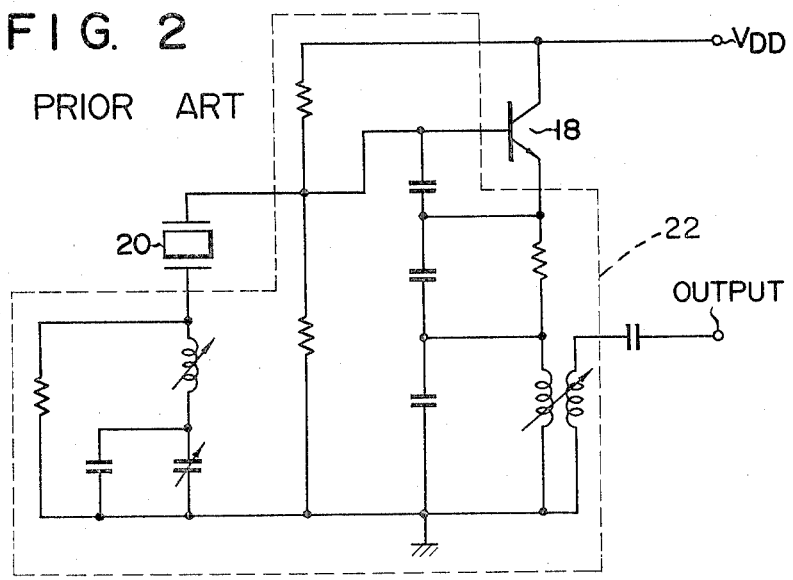
FIG. 2 is a circuit diagram of a conventional overtone crystal oscillating circuit.
Figure 3:
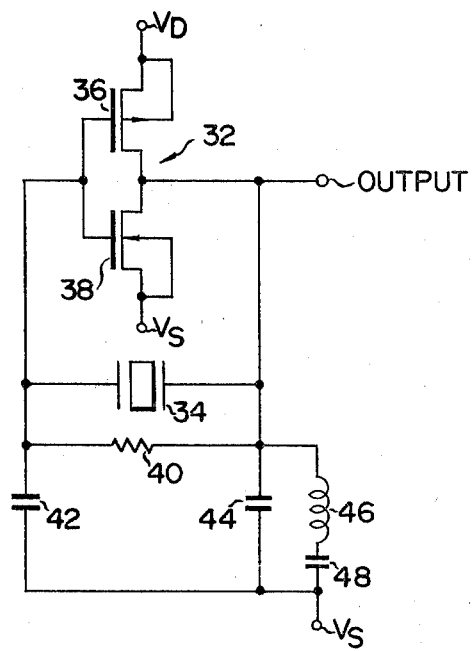
FIG. 3 is a circuit diagram of an embodiment of an overtone crystal oscillating circuit according to the invention.

FIG. 3 shows a crystal oscillating circuit having a CMOS inverter 32 and a resonator 34 connected between input and output terminals of the CMOS inverter 32. The CMOS inverter 32 includes P and N channel MOS transistors 36 and 38 of which the current paths are connected in series between a positive power source terminal $V_D$ and a reference power source terminal $V_S$. A back gate of the P channel MOS transistor 36 is connected with a source of the MOS transistor 36 and with the power source terminal $V_D$. A back gate of N channel MOS transistor 38 is connected with a source of the MOS transistor 38 and with the power source terminal $V_S$. A resonator 34 is constructed by forming a pair of electrodes on an AT-cut crystal piece.

Between the input and output terminals of the CMOS inverter 32, a DC feedback resistor 40 having a resistance of approximately $10^5$ to $10^8$ $\Omega$, for example, is connected. The resistor 40 is used to determine a level of DC bias voltage applied to the CMOS inverter 32 and the crystal resonator 34 at the initiation time of oscillation. Capacitors 42 and 44 are connected between the reference power source terminal $V_S$ and the input and output terminals of the CMOS inverter 32. A series circuit of an inductor 46 and a capacitor 48 is connected between the output terminal of CMOS inverter 32 and the reference power source terminal $V_S$.

The capacitance of the input capacitor 42 is selected properly depending on the frequency, inductance characteristic and the like of the oscillating circuit. In order to perform a stable overtone oscillating operation of 14 MHz or more as in the embodiment, the input capacitor 42 is selected to have a capacitance from several pF to ten-odd pF. The capacitor 48 is used for preventing the inductor 46 from being short-circuited to the reference power source terminal $V_S$ in a direct current mode and has a capacitance of 0.01 $\mu$F, for example. The inductor 46, in cooperation with the capacitor 44, constitutes a tuning circuit to select an overtone frequency which is an odd multiple of the fundamental frequency of the crystal resonator 34.

Figure 4:
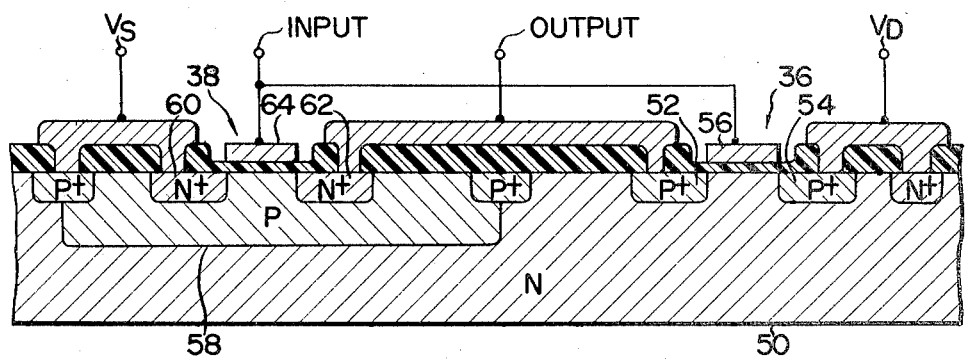
FIG. 4 is a cross-sectional view of a semiconductor device forming the CMOS inverter used in the oscillating circuit in FIG. 3.

FIG. 4 is a cross-sectional view of a semiconductor device which illustrates a structure of the CMOS inverter 32 in FIG. 3. In FIG. 4, the P channel MOS transistor 36 of the CMOS inverter 32 is fabricated by P+ type semiconductor regions 52 and 54 formed in the surface region of an N conductivity type semiconductor substrate 50 and by a gate electrode 56 insulatively formed on the semiconductor substrate 50 disposed between the P+ type regions 52 and 54. The N channel MOS transistor 38 is constructed by N+ type semiconductor regions 60 and 62 formed in the surface region of a P-well 58 formed in the semiconductor substrate 50 and by a gate electrode 64 insulatively formed on the P-well 58 disposed between the N+ type regions 60 and 62.

In order to make the inverting operation time or signal transfer time sufficiently shorter than a period of one cycle of an oscillating signal from the oscillating circuit, it is necessary to select the effective channel length of the P and N channel MOS transistors 36 and 38 below a given value. Suppose now that a CMOS inverter is formed by using P and N channel MOS transistors with effective channel lengths of 5 $\mu$m or less and effective channel widths of 100 $\mu$m or more. Then, the CMOS inverter thus formed has such a signal transfer characteristic or a switching characteristic as shown in FIGS. 5A and 5B, under a condition that an ambient temperature is 25° C., the voltage between the power sources $V_D$ and $V_S$ is 5 V and the output capacitance of the CMOS inverter 32 is 15 pF.

When a signal level of an input signal to the CMOS inverter changes as shown in FIG. 5A, a signal level of an output signal of the CMOS inverter is changed with a slight time delay as shown in FIG. 5B. For example, a high level signal transfer time $T_{HL}$ from an instant that an input signal changes from low level to high level until the output signal reaches 50% of the power source voltage $V_D$, is 10 ns. A fall time $T_F$ that the output signal falls in level from 90% to 10% of the power source voltage $V_D$, is 10 ns.

To the contrary, a low level signal transfer time $T_{LH}$ from an instant that the input signal changes from low level to high level until the output signal becomes in level 50% of the power source voltage $V_D$, is 10 ns. A rise time $T_R$ that the output signal rises in level from 10% to 90% of the power source voltage $V_D$ is 13 ns.

Thus, by using the channel length less than 5 $\mu$m of the P and N channel MOS transistors 36 and 38 of the CMOS inverter 32, the signal transfer time of the CMOS inverter 32 may be shortened sufficiently.

Therefore, the CMOS inverter can process an input signal of approximately 100 MHz, for example.

FIG. 6 is an equivalent circuit of the crystal resonator when the crystal resonator 34 shown in FIG. 3 is in the resonant state. A capacitor 70 basically represents a capacitance between a pair of electrodes disposed on a crystal piece. A series circuit composed of a inductor 72, a capacitor 74 and a resistor 76 is a series resonating circuit for causing resonating phenomenon of the crystal resonator.

In the overtone crystal oscillating circuit for producing an n-th order high harmonic signal, it is well known that the values of the capacitor 70, the inductor 72 and the resistor 76 in the equivalent circuit as shown in FIG. 6 are fixed, for example, C0, L1 and R1, respectively, and that the capacitor 74 has a capacitance $1/n^2$ times the capacitance C1 obtained when the crystal oscillating circuit produces a fundamental frequency.

An angular frequency of the fundamental frequency is given by the following equation:

$$\omega 1 = (L1 \times C1)^{-\frac{1}{2}} \tag{1}$$

When it is used for the third order overtone crystal oscillating circuit for producing a third order high harmonic signal having a frequency of about 35 MHz, for example, the circuit constants of the equivalent circuit of the crystal resonator L1·C1/3² and C0 are respectively set to ten-odd mH, several mpF and several pF.

The overtone crystal oscillating circuit requires a tuning circuit to perform an oscillating operation with a desired order high harmonic frequency. In the embodiment, the capacitor 44 and the inductor 46 form a tuning circuit to determine an overtone oscillating frequency. A stray capacitor CS, which exists between the output terminal of the CMOS inverter 32 and the power source terminal $V_S$, may have a similar function to that of the capacitor 44. The parallel resonating frequency $f_R$ of the tuning circuit additionally including the stray capacitance CS is given as follows:

$$f_R = \tfrac{1}{2}\pi\{(C2+CS)\cdot L2\}^{-\frac{1}{2}} \tag{2}$$

where L2 is an inductance of the inductor 46 and C2 is a capacitance of the capacitor 44.

Accordingly a desired resonant frequency is obtained by properly selecting the values of the capacitor 44 and the inductor 46. For example, in the third order overtone crystal oscillating circuit, the parallel resonant frequency of the tuning circuit is set to a frequency $f_{R3}$ between a fundamental frequency $f_0$ of the crystal resonator and an overtone oscillating frequency $3f_0$ three times the fundamental oscillating frequency. In this case, a reactance-frequency characteristic of the tuning circuit including the inductor 46 and the capacitor 44 is indicated by a solid line in FIG. 7. In a case where the oscillating circuit shown in FIG. 3 is used as the third order overtone crystal oscillating circuit, it performs a stable overtone oscillating operation only near the third order overtone frequency by setting the parallel resonant frequency $f_R$ to an intermediate frequency between $f_0$ and $3f_0$. Generally, the n-th order overtone crystal oscillating circuit performs a stable overtone oscillating operation by setting the parallel resonating frequency $f_R$ to an intermediate frequency between $(n-2)f_0$ and $nf_0$, where, $f_0$ is defined to be equal to $\omega 1/2\pi$ [$\omega 1$ is expressed in equation (1)].

In the present embodiment, when the parameters C2, CS and L2 in the tuning circuit were respectively set to 10 pF, 5 pF and 2.2 μH, a parallel resonant frequency $f_R$ became about 28 MHz and a stable third order overtone oscillating operation was obtained at an oscillating frequency of about 35 MHz. That is, the parallel resonant frequency $f_R$ (≃28 MHz) is set between the fundamental frequency $f_0$ (≃35/3 MHz) and the third order overtone frequency $3f_0$ (≃35 MHz). In this case, the capacitance C2 and the inductance L2 may be variously changed in order to perform the stable operation.

The oscillating conditions of the crystal oscillating circuit as shown in FIG. 3 will be described with reference to FIG. 8.

Figure 8:
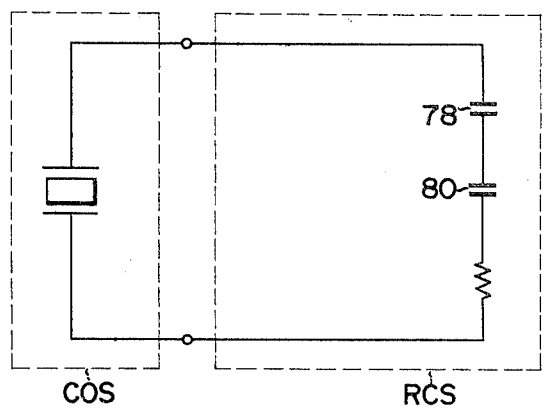
FIG. 8 is a circuit diagram of an equivalent circuit of the crystal oscillating circuit in FIG. 3.

The oscillating circuit using the crystal resonator may be considered separable, as shown in FIG. 8, into a circuit section COS when the crystal resonator is viewed from both terminals of the crystal resonator 34 and a circuit section RCS when the circuit except for the crystal resonator is viewed from both terminals of the crystal resonator. In this case, a complex impedance $Z_C$ of the circuit section COS may be expressed as $(R_C+jX_C)$ while a complex impedance $Z_L$ of the circuit section RCS may be expressed as $(-R_L+jX_L)$. Generally, in the stable oscillating conditions, the following relations hold between the impedance $Z_C$ of the crystal resonator 34 and the impedance $Z_L$ of the circuit section RCS.

$$X_C = -X_L \tag{3}$$

$$R_C = |-R_L| \tag{4}$$

In order to start the oscillation of the oscillating circuit, the following relation must hold in a DC operating condition immediately before the oscillation starts.

$$R_C < |-R_L| \tag{5}$$

Therefore, after the oscillation has started, a negative resistance $-R_L$ decreases by a nonlinear amplifying characteristic of the CMOS inverter 32 and the oscillation becomes in a stable condition at the time that the equation (3) is satisfied.

In a state that the oscillating circuit oscillates at an angular frequency $\omega_K$, an impedance $Z_{LK}$ of the circuit section RCS in FIG. 8 is given by the following equation:

$$Z_{LK} = -\frac{gm}{\omega_K^2 \times C3 \times C4} + \frac{1}{j\omega_K \times C4} + \frac{1}{j\omega_K \times C5} \tag{6}$$

where C4 and C5 respectively represent capacitances of the equivalent capacitors 78 and 80.

In the equation (6), the first capacitance C4 forming the reactance component is an equivalent capacitance given by the tuning circuit connected to the output terminal of the CMOS inverter 32 in the oscillating circuit shown in FIG. 3 and is expressed by the following equation:

$$\omega_K \cdot C4 \simeq \omega_K(C2 + CS) - \frac{1}{\omega_K L2} \tag{7}$$

In the equation (6), the second capacitance C5 forming the reactance component is the sum of a capacitance C6 of the capacitor 42 connected to the input terminal of the CMOS inverter 32 and the resultant capacitance CN composed of capacitances between gates and drains of the MOS transistors 36 and 38 forming the CMOS inverter 32, capacitances between gates and sources and capacitances between gates and a substrate, and is given by the following equation:

$$\omega_K C5 = \omega_K(C6 + CN) \tag{8}$$

From the equations (3) and (6), we have $$\frac{1}{\omega_K C_C} = -\left(\frac{1}{\omega_K C4} + \frac{1}{\omega_K C5}\right) \tag{9}$$

where:

$$\omega_K C_C = \omega_K C1 - \frac{1}{\omega_K L1} \tag{10}$$

As seen from the equation (9), when CS, CN, C1, C2, C6, L1 and L2 with proper values are used, a stable oscillating operation with a desired angular frequency is obtained. For example, in the crystal oscillating circuit with a third order overtone resonator using an AT-cut crystal piece, a stable oscillating operation is obtained at a frequency of 35.47 MHz, assuming that C1=0.00015 pF, L1=13 mH, C2=8 pF, L2=2.2 μH and C6=5 pF.

The oscillation starting condition given by the equation (5) will be explained. The condition is satisfied when a real part on the right side of the equation (6), or the negative resistive component $|-gm/\omega_K^2 \times C3 \times C4|$ is larger than a resistance value of the resistor 76 included in the equivalent circuit of the crystal resonator 34. Generally, in the crystal resonator used in the overtone oscillating circuit, the resistance value of the resistor 76 is about 20 Ω.

In the present embodiment, when the 35 MHz overtone oscillating circuit is constructed, $1/\omega_K^2 \times C3 \times C4$ takes a value of about $0.1 \times 10^7$ Ω². The value gm is a transconductance of the CMOS inverter 32. Immediately before the oscillation starts, the CMOS inverter 32 is biased by the feedback resistor 40 in a DC mode. It is considered therefore that the voltage levels at the input and output terminals of the CMOS inverter 32 are both at an intermediate level between the power source voltages $V_D$ and $V_S$. Accordingly, in this case, if the MOS transistors 36 and 38 operate in the saturated region, gm is approximately given by the following equation:

$$gm = |\beta_P| \cdot |V_{GP} - V_{TP}| + |\beta_N| \cdot |V_{GN} - V_{TN}| \tag{11}$$

where $\beta_P$ and $\beta_N$ are gain parameters of the MOS transistors 36 and 38, $V_{GP}$ and $V_{GN}$ are voltage applied to the gates of the MOS transistors 36 and 38, and $V_{TP}$ and $V_{TN}$ are threshold voltages of the MOS transistors 36 and 38, respectively.

When the CMOS inverter is formed of P and N channel MOS transistors each having an effective channel length of less than 5 μm and an effective channel width of more than 100 μm, the gm of approximately 0.2 to 0.5 mΩ is obtained. Accordingly, the negative resistance $|gm/\omega_K^2 \cdot C3 \cdot C4|$ is 200 to 500 Ω, thereby to easily satisfy the oscillation starting condition of the equation (5).

Figure 9:
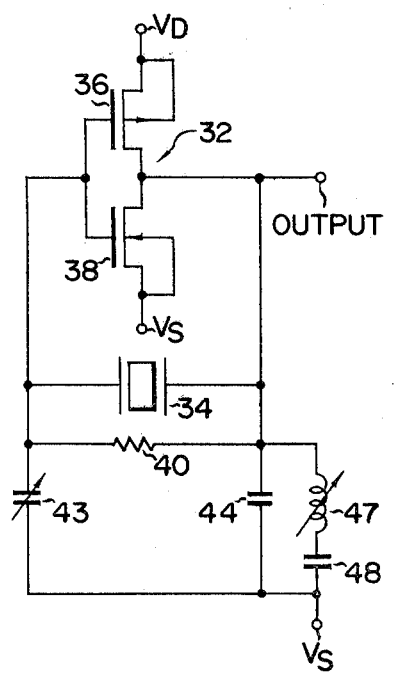
FIGS. 9 to 12 are circuit diagrams of modifications of the crystal oscillating circuit in FIG. 3.
Figure 10:
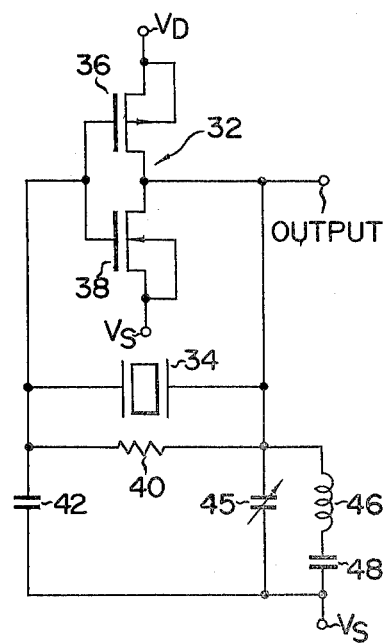

FIGS. 9 and 10 show modifications of the oscillating circuit shown in FIG. 3. In the oscillating circuit shown in FIG. 9, a variable capacitor 43 and a variable inductor 47 are used in place of the capacitor 42 and the inductor 46, respectively. In the oscillating circuit shown in FIG. 10, a variable capacitor 45 is used in place of the capacitor 44.

In order to make a fine adjustment of the oscillating frequency of the oscillating circuit shown in FIG. 3, the oscillating frequency changes depending on the values of the capacitors 42 and 44 and the inductor 46, as seen from the equations (7), (8) and (9). Therefore, all a designer has to do is to use at least one of the variable capacitors 43 and 45 and the variable inductor 47, as shown in FIGS. 9 and 10. In this case, it is possible to independently operate the variable capacitors and inductors in order to adjust the oscillating frequency.

For example, in the 35 MHz third order overtone oscillating circuit, when the variable capacitor 43 shown in FIG. 9 is formed as a capacitor variable within the range of 12 pF, the frequency is finely adjustable within $\pm 10 \times 10^{-6}$.

Figure 11:
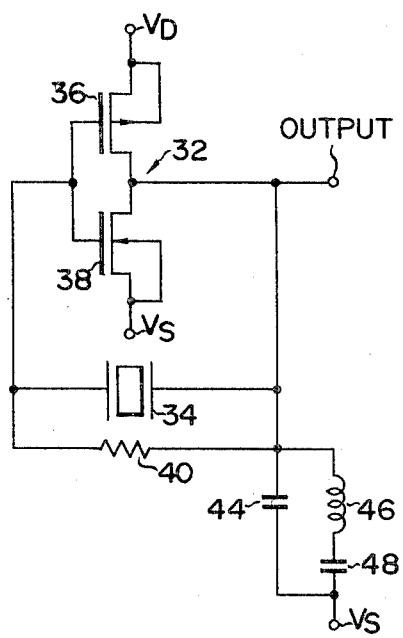
Figure 12:
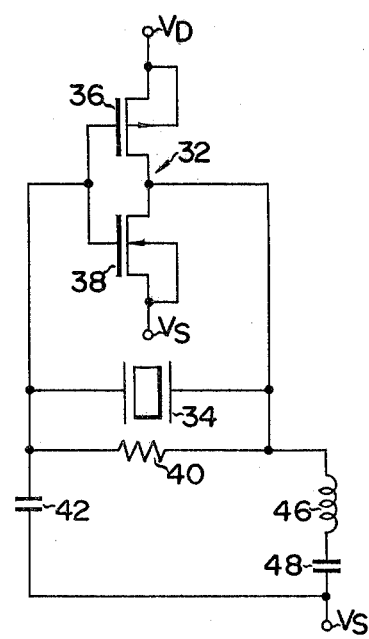

FIG. 11 shows an oscillating circuit according to another embodiment of the invention. The circuit construction of the oscillating circuit is the same as that of the oscillating circuit shown in FIG. 3, except that the capacitor 42 used in the oscillating circuit shown in FIG. 3 is omitted. As described above, an equivalent capacitance CN is connected to the input terminal of the CMOS inverter 32. Since the capacitance CN generally reaches several pF, to decrease the number of parts for cost reduction, it is possible to omit the input capacitor 42 as shown in FIG. 11. When the stray capacitance formed on the output terminal side of the CMOS inverter is large, the capacitor 44 may be omitted as shown in FIG. 12 for the same reason as that in the embodiment shown in FIG. 11.

Figure 13:
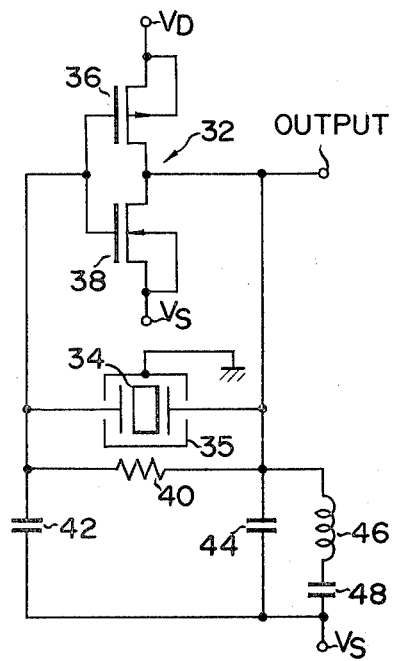
FIGS. 13 to 15 are circuit diagrams of other embodiments of the crystal oscillating circuit according to this invention.

FIG. 13 shows an oscillating circuit according to a further embodiment of the present invention. In this embodiment, in order to set up a more stable oscillation, the crystal resonator 34 is enclosed by an electrically conductive shield member 35. The transconductance of the CMOS inverter 32 serving as an amplifier takes a small value which is 1/100 of that of the bipolar transistor. Therefore, it is preferable to minimize the electrical effect from the exterior upon the crystal resonator 34. Accordingly, by enclosing the crystal resonator 34 by the conductive shield member 35 kept at the ground potential, for example, the undesired effect from exterior to the crystal resonator is restricted to a minimum. As a result, even when the oscillating circuit is driven by a low voltage source, the oscillating circuit provides a stable oscillation.

Figure 14:
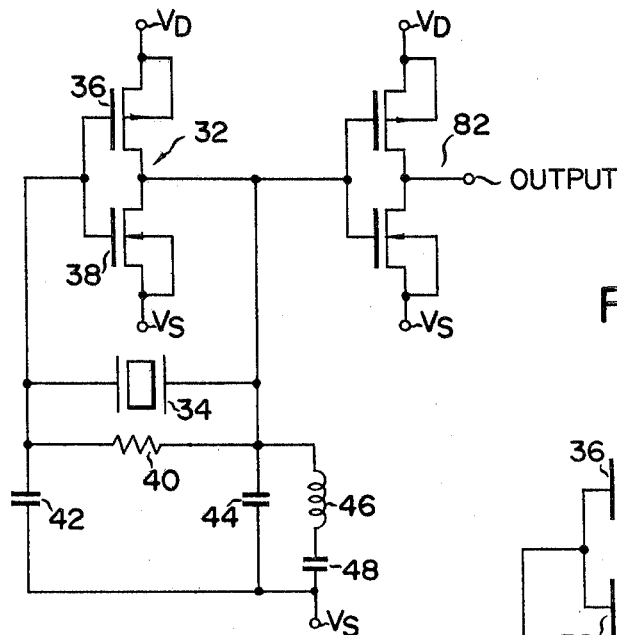

Referring now to FIG. 14 illustrating an oscillating circuit according to another embodiment of the invention, an oscillating circuit is constructed such that a CMOS inverter 82 including P and N channel MOS transistors is connected to the output terminal of the oscillating circuit shown in FIG. 3. As described above, the transconductance gm of the CMOS inverter 32 acting as an amplifier is small, so that an amplitude of an overtone oscillating signal appearing at the output terminal of the CMOS inverter 32 becomes smaller as the oscillating frequency is higher. Accordingly, where an oscillating signal is used as a clock signal, for example, it is preferable to connect the buffer inverter 82 to the output terminal of the CMOS inverter 32, as shown in FIG. 14. Since the input impedance of the CMOS inverter 82 is high, there is no need for increasing the current drive ability of the CMOS inverter 32. The CMOS inverter 82 has a construction similar to that of the CMOS inverter 32. This indicates that both the CMOS inverters 32 and 82 may be formed by the same CMOS manufacturing process. Although the CMOS inverter 82 is connected between the power source terminals $V_D$ and $V_S$ in the present embodiment, it may be connected between power source terminals different from the former ones.

Figure 15:
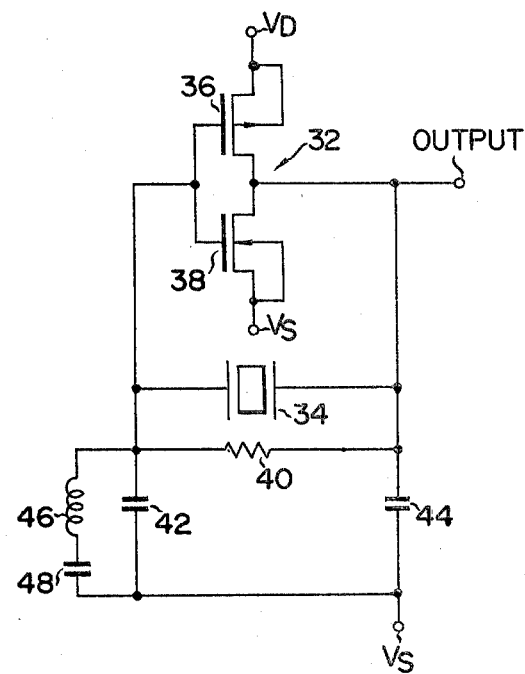
Figure 16:
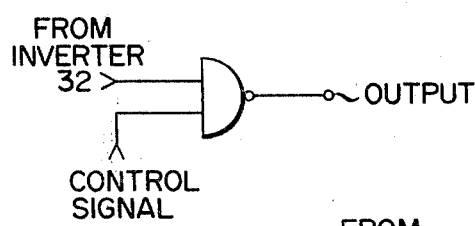
FIGS. 16 and 17 respectively show a CMOS NAND gate circuit and a CMOS NOR gate circuit which can be used instead of the output CMOS inverter in the crystal oscillating circuit in FIG. 14.
Figure 17:
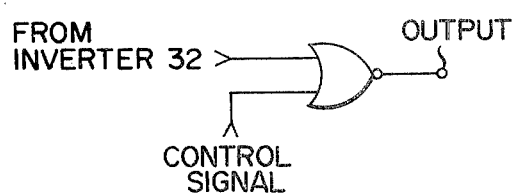

While the present invention is described by using some embodiments, the present invention is not limited to only such embodiments. In the above-mentioned embodiments, the series circuit including the inductor 46 and the capacitor 42 is connected in parallel with the capacitor 44 connected to the output of the CMOS inverter 32. Instead of this connection, the series circuit may be connected in parallel with the capacitor 42 connected to the input terminal of the CMOS inverter 32 thereby to form a parallel resonant circuit, as shown in FIG. 15. In the embodiment shown in FIG. 14, the CMOS inverter 82 may be replaced by a CMOS gate circuit with an amplifying function such as a CMOS type NAND gate circuit shown in FIG. 16 or CMOS type NOR gate circuit shown in FIG. 17. Also in the embodiment of FIG. 14, the capacitors 42 and 44, and the inductor 46 may be of the variable type. In the embodiments, one end of each of the capacitors 42, 44 and 48 is commonly connected to the power source terminal $V_S$. However, the power source terminal $V_S$ may be replaced by a proper DC power source terminal or a ground terminal.

What we claim is:

1. An overtone crystal oscillating circuit comprising:
   a first complementary MOS inverter circuit having input and output terminals;
   a crystal resonator connected between the input and output terminals of said inverter circuit;
   resistive means connected between the input and output terminals of said inverter circuit;
   first and second capacitances respectively connected to the input and output terminals of said inverter circuit; and
   a series circuit, including inductance and capacitance, which is connected in parallel with one of said first and second capacitances thereby to form a parallel resonating circuit.

2. An overtone crystal oscillating circuit according to claim 1 wherein said parallel resonating circuit has a resonating frequency an odd number of times higher than a fundamental frequency of said crystal resonator.

3. An overtone crystal oscillating circuit according to claim 1 wherein said complementary MOS inverter circuit is comprised of P and N channel MOS transistors of which the channel lengths are each less than 5 $\mu$m.

4. An overtone crystal oscillating circuit according to claim 1 or 2 wherein at least one of said first and second capacitances includes a variable capacitor.

5. An overtone crystal oscillating circuit according to claim 4 wherein said inductance includes a variable inductor.

6. An overtone crystal oscillating circuit according to claim 1 or 2 wherein said inductance includes a variable inductor.

7. An overtone crystal oscillating circuit according to claim 1 or 2 wherein said crystal resonator is electrically shielded by a shielding member.

8. An overtone crystal oscillating circuit according to claim 1 or 2 further comprising a second complementary MOS inverter circuit which is connected to the output terminal of said first complementary MOS inverter circuit to amplify the output signal from said first complementary MOS inverter circuit.

9. An overtone crystal oscillating circuit according to claim 8 wherein said inductance includes a variable inductor.

10. An overtone crystal oscillating circuit according to claim 1 or 2 wherein said first capacitance includes a stray capacitance associated with the input terminal of said first complementary CMOS inverter circuit.

11. An overtone crystal oscillating circuit according to claim 1 or 2 wherein said second capacitance includes a stray capacitance associated with the output terminal of said first complementary CMOS inverter circuit.

12. An overtone crystal oscillating circuit according to claim 1 or 2 wherein said series circuit having said inductance and capacitance is connected in parallel with said first capacitance.

13. An overtone crystal oscillating circuit according to claim 1 or 2 wherein said series circuit having said inductance and capacitance is connected in parallel with said second capacitance.

14. An overtone crystal oscillating circuit according to claim 1 or 2 further comprising a logic gate circuit which is connected to the output terminal of said first complementary MOS inverter circuit to amplify the output signal from said first complementary MOS inverter circuit.

15. An overtone crystal oscillating circuit according to claim 14 wherein said logic gate circuit includes a NAND gate circuit.

16. An overtone crystal oscillating circuit according to claim 14 wherein said logic gate circuit includes a NOR gate circuit.

* * * * *